(12) United States Patent
Itakura et al.

(10) Patent No.: US 8,605,212 B2
(45) Date of Patent: Dec. 10, 2013

(54) SOLID-STATE IMAGE SENSING DEVICE HAVING A REDUCED SIZE AND METHOD FOR FABRICATING THE SAME

(75) Inventors: Keijirou Itakura, Osaka (JP); Masayuki Masuyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 126 days.

(21) Appl. No.: 13/168,541

(22) Filed: Jun. 24, 2011

(65) Prior Publication Data

US 2011/0254988 A1 Oct. 20, 2011

Related U.S. Application Data

(63) Continuation of application No. PCT/JP2009/006773, filed on Dec. 10, 2009.

(30) Foreign Application Priority Data

Dec. 26, 2008 (JP) ................................. 2008-332615
Sep. 18, 2009 (JP) ................................. 2009-217348

(51) Int. Cl.
 *H04N 5/225* (2006.01)
(52) U.S. Cl.
 USPC .......................................... 348/374; 348/372
(58) Field of Classification Search
 USPC .......... 348/374, 294, 300, 302, 311, 312, 372
 See application file for complete search history.

(56) References Cited

U.S. PATENT DOCUMENTS 7,009,287 B2 * 3/2006 Sun et al. ...................... 257/686
7,129,985 B1 * 10/2006 Koizumi et al. ............... 348/372
7,164,113 B2 * 1/2007 Inokuma et al. ............ 250/208.1
7,271,834 B2 * 9/2007 Kasuga et al. ................ 348/308
7,868,283 B2 * 1/2011 Mabuchi .................... 250/208.1
7,944,492 B2 * 5/2011 Ui ................................. 348/308
2004/0095495 A1 * 5/2004 Inokuma et al. .............. 348/308
2004/0135919 A1 * 7/2004 Kim et al. ..................... 348/340
2004/0263668 A1 * 12/2004 Kim et al. ..................... 348/340
2005/0024524 A1 * 2/2005 Yourlo et al. ................. 348/372
2005/0189624 A1 * 9/2005 Sun et al. ...................... 257/666
2008/0042227 A1 2/2008 Asano et al.
2010/0045835 A1 * 2/2010 Matsunaga ................... 348/308

(Continued)

FOREIGN PATENT DOCUMENTS

JP 04-200161 7/1992
JP 11-261044 9/1999

(Continued)

OTHER PUBLICATIONS

Translation of JP 2002-289908 A; Apr. 10, 2002.*

*Primary Examiner* — John Villecco
(74) *Attorney, Agent, or Firm* — McDermott Will & Emery LLP

(57) ABSTRACT

A solid-state image sensing element (1) has a main face provided with an imaging region (1a) in which unit pixels containing photoelectric conversion elements are formed in matrix. Peripheral circuit elements (3, 4) are configured to control imaging operation of the solid-state image sensing element (1) or to perform signal processing of an image output of the solid-state image sensing element (1). The imaging region (1a) is covered with a transparent material (2). The peripheral circuit elements (3, 4) are mounted to a region of the main face of the solid-state image sensing element (1) except for the imaging region (1a) such that main faces of the peripheral circuit elements (3, 4) face the main face of the solid-state image sensing element (1).

5 Claims, 10 Drawing Sheets

(56) References Cited

U.S. PATENT DOCUMENTS

| | | | |
|---|---|---|---|
| 2011/0063483 A1* | 3/2011 | Rossi et al. | 348/294 |
| 2011/0141318 A1* | 6/2011 | Lee et al. | 348/240.2 |
| 2012/0175760 A1* | 7/2012 | Nishikawa | 257/676 |
| 2012/0293698 A1* | 11/2012 | Sukegawa et al. | 348/294 |

FOREIGN PATENT DOCUMENTS

| | | | |
|---|---|---|---|
| JP | 2000-224495 | | 8/2000 |
| JP | 2002-289908 | | 10/2002 |
| JP | 2004-146728 | | 5/2004 |
| JP | 2005012221 A | * | 1/2005 |
| JP | 2005-109092 | | 4/2005 |
| JP | 2006-049361 | | 2/2006 |
| JP | 2006197426 A | * | 7/2006 |
| JP | 2006-237772 | | 9/2006 |
| JP | 2007-134725 | | 5/2007 |
| JP | 2008053286 A | * | 3/2008 |
| JP | 2008-186875 | | 8/2008 |
| JP | 2008270423 A | * | 11/2008 |

* cited by examiner

FIG.4
(a) 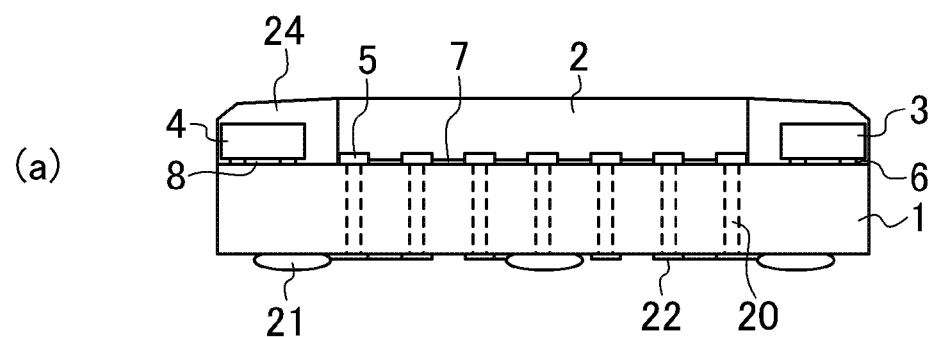
(b) 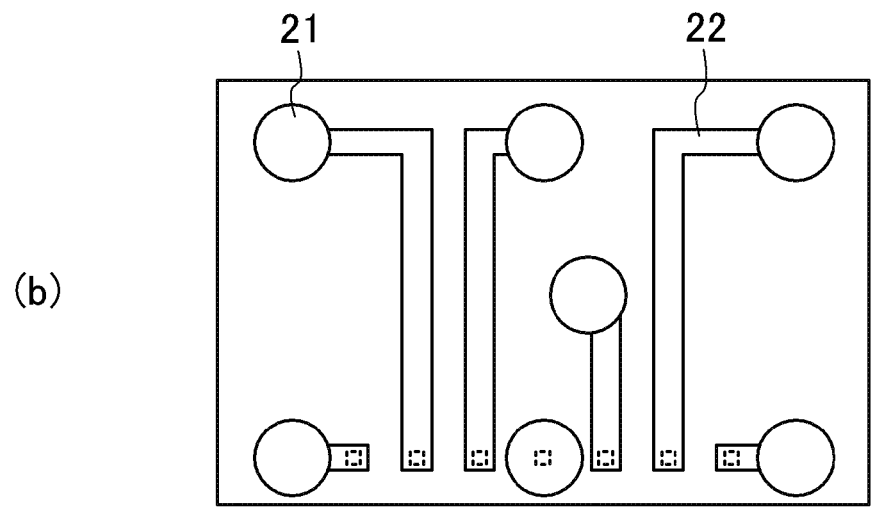

FIG.6
(a)
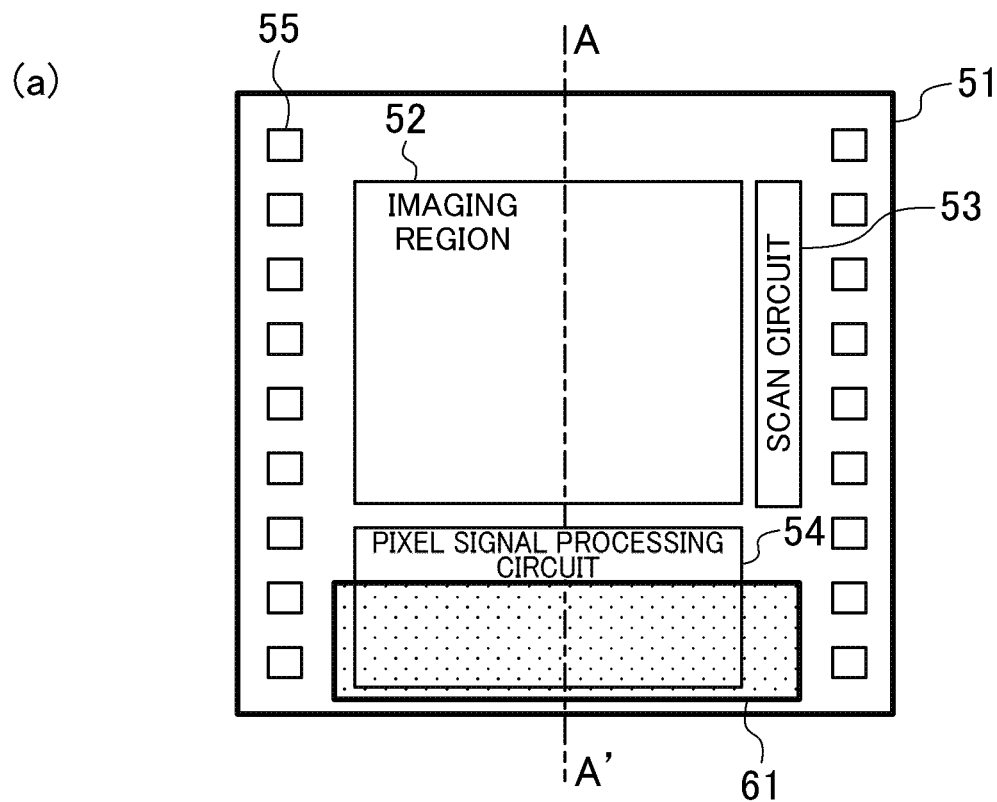
(b)
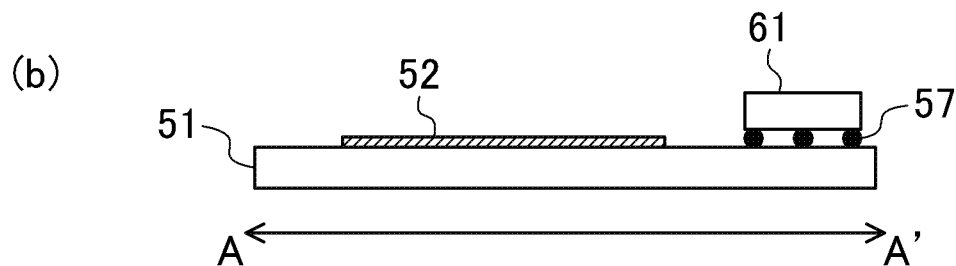

SOLID-STATE IMAGE SENSING DEVICE HAVING A REDUCED SIZE AND METHOD FOR FABRICATING THE SAME

CROSS-REFERENCE TO RELATED APPLICATION

This is a continuation of PCT International Application PCT/JP2009/006773 filed on Dec. 10, 2009, which claims priority to Japanese Patent Application No. 2008-332615 filed on Dec. 26, 2008, and Japanese Patent Application No. 2009-217348 filed on Sep. 18, 2009. The disclosures of these applications including the specifications, the drawings, and the claims are hereby incorporated by reference in their entirety.

BACKGROUND

The present disclosure relates to small-size, low-cost solid-state image sensing devices, and to methods for fabricating the same.

In recent years, as a solid-state image sensing device, for example, Japanese Patent Publication No. 2000-224495 has disclosed a solid state image sensor as illustrated in FIG. 10 in which a sensor block 151 and a signal processing block 152 are integrated into a same semiconductor substrate in order to reduce the size and the power consumption and to increase the signal processing speed of the solid state image sensor. Moreover, based on the configuration, in order to further reduce the size and to further increase the speed, a configuration referred to as system in package (SIP) has been reported, wherein a solid-state image sensing element and a plurality of chips serving as peripheral circuits of the solid-state image sensing element are integrally mounted as a semiconductor module.

For example, Japanese Patent Publication No. H11-261044 (page 7, FIG. 1) discloses a configuration as illustrated in FIG. 11 in which a solid-state image sensing element 112 and a peripheral circuit element 111 are mounted by being stacked, and the solid-state image sensing element 112 is electrically connected to the peripheral circuit element 111 via a multilayer substrate 110.

Moreover, for example, Japanese Patent Publication No. 2006-49361 discloses a configuration as illustrated in FIG. 12 in which a back face irradiation type CMOS image sensor chip 154 is mounted by being stacked on a signal processing chip 153 via microbumps 155, where signals are input/output via the signal processing chip 153.

Furthermore, Japanese Patent Publication No. 2004-146728 (page 9, FIG. 1) discloses a configuration of a general semiconductor device which is not a solid-state image sensing device, the size of the general semiconductor device being reduced by the chip on chip (COC) technology of connecting main faces of different semiconductor elements to each other with the main faces facing each other.

SUMMARY

In the configuration illustrated in FIG. 11, the peripheral circuit element 111 is flip-chip mounted to the multilayer substrate 110, the solid-state image sensing element 112 is mounted to a back face of the peripheral circuit element 111, and the solid-state image sensing element 112 is connected to the multilayer substrate 110 via a wire bond. However, in recent years, the number of input/output terminals of a solid-state image sensing element has been increased, which has increased the wiring density of a multilayer substrate having a configuration as illustrated in FIG. 11, thereby increasing cost, or has required an area for wire bonds of the large number of input/output terminals, so that miniaturization is substantially impossible.

Alternatively, when the COC technology disclosed in Japanese Patent Publication No. 2004-146728 is applied to a solid-state image sensing device, dust may settle on an imaging region, or stress may be applied to the imaging region at the time of mounting a peripheral circuit element to a solid-state image sensing element. This may degrade the performance or lower the yield. Thus, application of the COC technology to a solid-state image sensing device has been difficult.

In the configuration illustrated in FIG. 10, transistors having a plurality of kinds of gate insulating films have to be integrated into the same semiconductor substrate, which complicates processing. Moreover, when a signal processing block having complicated functions is mounted to the same semiconductor substrate, the number of wires connecting circuits to each other increases, so that it is necessary to increase the number of wiring layers or to increase the area for the wires.

However, if the number of the wiring layers is increased, a distance from a photodiode for receiving light to an opening, which is defined at an uppermost wiring layer, increases, so that an oblique ray is shielded, which may cause a reduction in sensitivity. In particular, when the cell size (pitch) of pixels is reduced, the disadvantage resulting from the increased number of the wiring layers becomes increasingly severe.

On the other hand, increasing the area for the wires directly leads to an increase in size of the solid state image sensor. For example, when five to six wiring layers, as is the case in a general system LSI, are used in a signal processing circuit, the transistor occupancy depending on transistor layout and wiring is about 80%. By contrast, when three wiring layers, as is generally the case in an image sensor, are used in consideration of the above-described problem of the reduction in sensitivity, the transistor occupancy is reduced to about 30-40%, so that the area of the signal processing circuit is more than double.

Moreover, in the configuration illustrated in FIG. 12, the image sensor chip 154 is mounted by being stacked on the signal processing chip 153 to address the above-described problem of increase in chip size. However, in this case, it is necessary to adhere the signal processing chip 153 and the image sensor chip 154 with their circuit surfaces facing each other, and thus a back face irradiation type image sensor having a circuit surface different from a light-receiving surface is used as the image sensor chip 154, which is a complicated configuration.

Moreover, the signal processing chip 153 is used as a substrate to which the image sensor chip 154 is mounted, and thus the signal processing chip 153 also has to receive a voltage used in the image sensor chip 154 generally having a high working voltage.

Furthermore, in an another example configuration having a SIP structure, a solid-state image sensing element is laid on and attached to a signal processing element, and a substrate of the solid-state image sensing element is provided with a through wire, thereby electrically connecting the solid-state image sensing element to the signal processing element under the solid-state image sensing element by using a microbump. However, also in this case, a solid-state image sensing element having a complicated configuration as illustrated in FIG. 12 is required.

In another example configuration, a solid-state image sensing element is laid on and attached to a signal processing element, both of these elements are disposed on a circuit board, and the elements are wire bonded to the circuit board, so that both the elements are electrically connected to each other by the wire bonding. However, in this configuration, an input/output terminal cannot be miniaturized, and thus this configuration is not suited to reduce the size. Moreover, a problem in which the configuration is not suitable to increase the speed due to the impedance of a wire bond is also caused.

In more recent years, a miniaturization process of the system LSI has advanced, and in a solid-state image sensing element for which an imaging region is uniquely determined based on the optical size, the area of a signal processing circuit has significantly been reduced. Therefore, in actual devices, the chip size depends on the number of input/output terminals of a signal processing element.

In view of the problems discussed above, the present disclosure describes a reduced-size, solid-state image sensing device with an imaging region that is not influenced by dust or stress.

Moreover, the present disclosure describes a further reduction in size and cost of a solid-state image sensing device including a solid-state image sensing element and a signal processing element while solving the above-discussed problems.

An example solid-state image sensing device of the present invention includes a solid-state image sensing element having a main face provided with an imaging region in which unit pixels containing photoelectric conversion elements are formed in matrix; and a peripheral circuit element configured to control imaging operation of the solid-state image sensing element or to perform signal processing of an image output of the solid-state image sensing element, wherein the peripheral circuit element is mounted by attaching the peripheral circuit element to a region of the main face of the solid-state image sensing element except for the imaging region such that a main face of the peripheral circuit element faces the main face of the solid-state image sensing element, and the imaging region is covered with a transparent material.

With this configuration, the peripheral circuit element is mounted by attaching to a region of the solid-state image sensing element except for the imaging region such that the main faces of the peripheral circuit element and the solid-state image sensing element face each other, so that a multilayer substrate or a wire bond is no longer necessary to electrically connect the solid-state image sensing element to the peripheral circuit element, which can reduce the size and cost of the solid-state image sensing device. Moreover, an advance in bump forming technique of recent years allows connection of a large number of input/output terminals between the solid-state image sensing element and the peripheral circuit element, so that data can be transferred in parallel, thereby increasing the speed and reducing the power consumption. Further, the imaging region of the solid-state image sensing element is covered with a transparent material, and thus the transparent material can eliminate the influence of dust on the imaging region and alleviate stress exerted on the imaging region at the time of mounting the peripheral circuit element.

In the above example solid-state image sensing device, the transparent material is preferably adhered to a surface of the imaging region by an adhesive. This configuration can more effectively alleviate the stress exerted on the imaging region at the time of mounting the peripheral circuit element.

In the above example solid-state image sensing device, the solid-state image sensing element preferably includes a through electrode electrically connecting the main face to a back face of the solid-state image sensing element, and a connection terminal formed on the back face of the solid-state image sensing element, the connection terminal being electrically connected to the through electrode. With this configuration, electrical connection is established only by attaching the back face of the solid-state image sensing element to a substrate. Thus, when the solid-state image sensing device is mounted to a camera, or the like, it is possible to reduce the mounting cost and the mounting volume of the solid-state image sensing device.

An example method for fabricating a solid-state image sensing device of the present invention includes: preparing a wafer including a solid-state image sensing element having a main face provided with an imaging region in which unit pixels containing photoelectric conversion elements are two-dimensionally arranged in matrix; providing a transparent material to cover the imaging region of the solid-state image sensing element; and after the transparent material is provided, mounting a peripheral circuit element by attaching the peripheral circuit element to a region of the main face of the solid-state image sensing element except for the imaging region such that a main face of the peripheral circuit element faces the main face of the solid-state image sensing element, where the peripheral circuit element is configured to control imaging operation of the solid-state image sensing element, or to perform signal processing of an image output of the solid-state image sensing element.

With this configuration, after the transparent material is provided to cover the imaging region of the solid-state image sensing element, the peripheral circuit element is mounted by attaching to a region of the solid-state image sensing element except for the imaging region such that the main faces of the peripheral circuit element and the solid-state image sensing element face with each other. Thus, the transparent material can eliminate the influence of dust on the imaging region, and can alleviate stress exerted on the imaging region at the time of mounting the peripheral circuit element.

Another example solid-state image sensing device of the present invention includes a solid-state image sensing element having a main face provided with an imaging region in which unit pixels containing photoelectric conversion elements are formed in matrix; and a signal processing element having a main face provided with a circuit configured to perform signal processing of an image output of the solid-state image sensing element, wherein the signal processing element is mounted by attaching the signal processing element to a region of the main face of the solid-state image sensing element except for the imaging region such that the main face of the signal processing element faces the main face of the solid-state image sensing element, and an electric pathway to the solid-state image sensing element is formed in the region where the signal processing element is mounted to the solid-state image sensing element, and input/output between the signal processing element and an outside of the solid-state image sensing device is performed via the electric pathway, and an internal circuit and an input/output terminal of the solid-state image sensing element.

With this configuration, the signal processing element is mounted to a region of the solid-state image sensing element except for the imaging region, and the electric pathway is formed in the region where the signal processing element is mounted. Thus, a complicated construction such as a back face irradiation type solid-state image sensing element, a through wire interconnect structure, a multilayer substrate, or the like is not necessary to electrically connect the solid-state image sensing element to the signal processing element. Therefore, the size and cost of the solid-state image sensing device can be reduced. Moreover, input/output between the signal processing element and the outside of the solid-state image sensing device is performed via the internal circuit and the input/output terminal of the solid-state image sensing element. Thus, in the signal processing element, a protection circuit for input/output can be omitted, or simplified, and it is no longer necessary to form a high voltage transistor, so that a significant reduction in size and cost is possible.

According to the present invention, the influence of dust on the imaging region can be eliminated, and stress exerted on the imaging region can be alleviated at the time of mounting the peripheral circuit element. Thus, the size of the solid-state image sensing device can be reduced without degrading performance or reducing yield.

Moreover, according to the present invention, it is possible to further reduce the size and cost of a solid-state image sensing device including a solid-state image sensing element and a signal processing element.

BRIEF DESCRIPTION OF THE DRAWINGS

FIG. 1A is a plan view, and FIG. 1B is a cross-sectional view.

FIGS. 4A, 4B are views illustrating a configuration of a solid-state image sensing device of a second embodiment, where FIG. 4A is a side view, and FIG. 4B is a bottom view.

FIGS. 6A, 6B are views illustrating a configuration of a solid-state image sensing device of a fourth embodiment, where FIG. 6A is a plan view, and FIG. 6B is a cross-sectional view.

DETAILED DESCRIPTION

Figure 1:
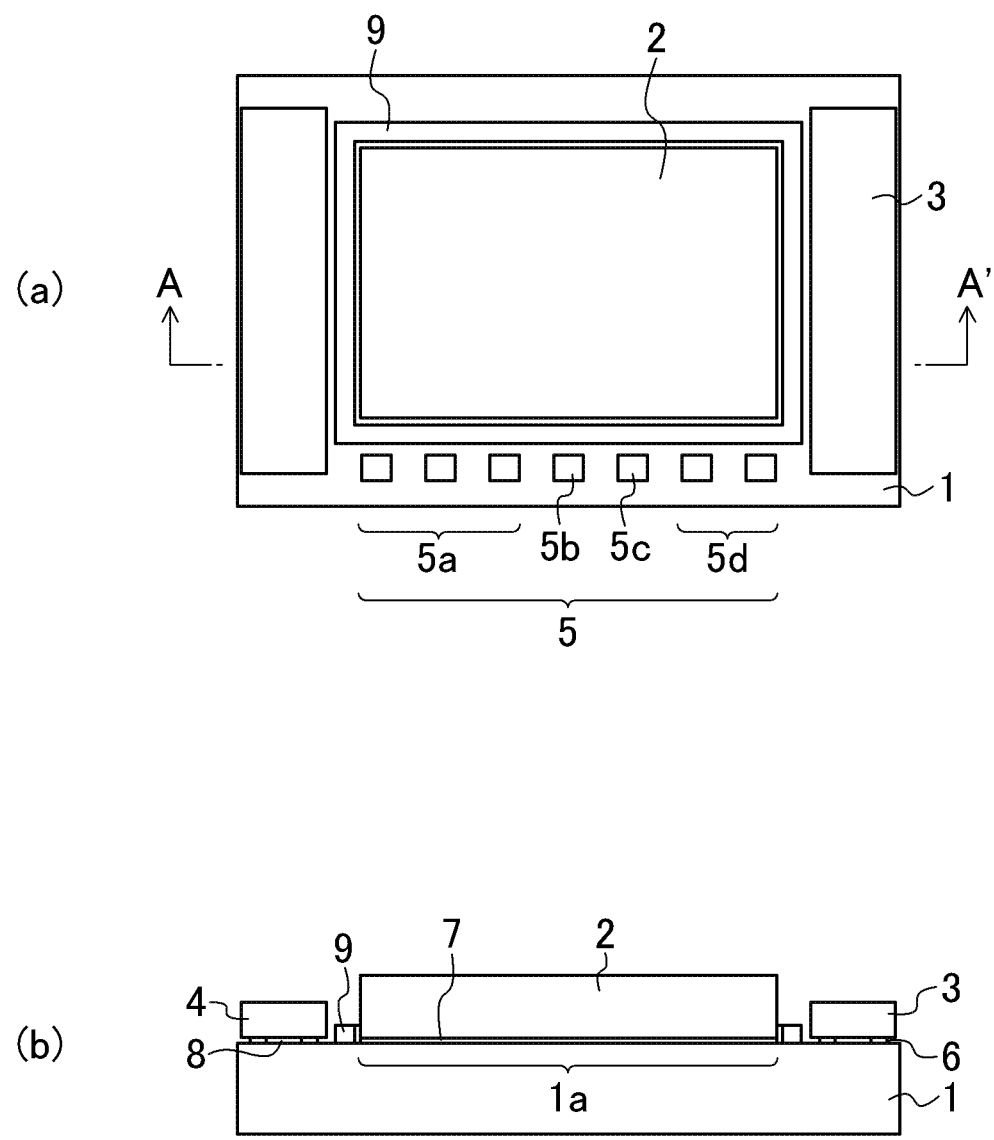
FIGS. 1A, 1B are views illustrating a configuration of a solid-state image sensing device of a first embodiment, where

Embodiments of the present invention will be described below in detail with reference to the drawings.

First Embodiment

FIGS. 1A, 1B are views illustrating a configuration of a solid-state image sensing device of a first embodiment, where FIG. 1A is a plan view, and FIG. 1B is a cross-sectional view along the line A-A' of FIG. 1A. In FIGS. 1A, 1B, reference number 1 denotes a charge coupled device (CCD) image sensor chip serving as a solid-state image sensing element. The CCD image sensor chip 1 includes a main face provided with an imaging region 1a in which unit pixels containing photoelectric conversion elements and vertical CCDs are formed in matrix. Each vertical CCD transfers signal charge in the vertical direction. Although not shown, the CCD image sensor chip 1 further includes a horizontal CCD configured to transfer charge in the horizontal direction, and a detection section configured to convert signal charge to a signal voltage and output the signal voltage outside.

The imaging region 1a of the CCD image sensor chip 1 is covered with glass 2 used as a transparent material. The glass 2 is adhered to a surface of the imaging region 1a by an adhesive 7. To prevent the outflow of the adhesive 7 to regions except for the imaging region 1a when the glass 2 is adhered, a dam 9 is formed around the imaging region 1a.

Reference number 3 denotes a timing generator chip configured as a peripheral circuit element to control timing of driving the horizontal CCD and the vertical CCDs of the CCD image sensor chip 1. Reference number 4 denotes a CCD driver chip configured as a peripheral circuit element to drive the vertical CCDs. The timing generator chip 3 and the CCD driver chip 4 are mounted by attaching to regions of the main face of the CCD image sensor chip 1 except for the imaging region 1a such that main faces of the timing generator chip 3 and the CCD driver chip 4 face the main face of the CCD image sensor chip 1. Specifically, the CCD image sensor chip 1 is electrically connected to the timing generator chip 3 and to the CCD driver chip 4 via microbumps 6. In order to ensure the reliability of the chips 1, 3, and 4 which are flip-chip mounted, sealant 8 is inserted. Note that positions of the chips 3, 4 mounted to the CCD image sensor chip 1 are not limited to the positions on both sides of the imaging region 1a as illustrated in FIG. 1.

Reference number 5 denotes input/output pads formed on the CCD image sensor chip 1. Reference number 5a denotes a power supply pad via which power is supplied to the chips 1, 3, 4. The present embodiment includes three power supply pads 5a corresponding to, for example, power supply voltages of $-7$ V, $3.3$ V, and $12$ V, respectively. Reference number 5b denotes a GND pad which is connected to the chips 1, 3, and 4 as the power supply pads 5a are. Reference number 5c denotes an image output pad configured to output a signal of a picked-up image. Reference number 5d denotes control pads of the timing generator chip 3. Each control pad 5d receives, for example, a control signal to select a drive mode of the CCD image sensor chip 1. According to the mode selected based on the control signal, the timing generator chip 3 controls timing of driving the CCD image sensor chip 1.

In the configuration illustrated in FIG. 1, the surface of the imaging region 1a is covered with the glass 2 used as a transparent material. This eliminates a problem in which dust produced during flip-chip mounting settles on the imaging region 1a in a process for fabricating the solid-state image sensing device, and thus it is possible to avoid the influence of the dust. The glass 2 is adhered to the surface of the imaging region 1a by the adhesive 7, and thus serves to alleviate stress exerted on the imaging region 1a. That is, providing the glass 2 can protect the imaging region 1a from the stress exerted during flip-chip mounting. Of course, also in use of the solid-state image sensing device as a product, the glass 2 can protect the imaging region 1a from dust and stress. Note that the transparent material of the present embodiment is not limited to glass, but may be, for example, an acrylic material.

Figure 2:
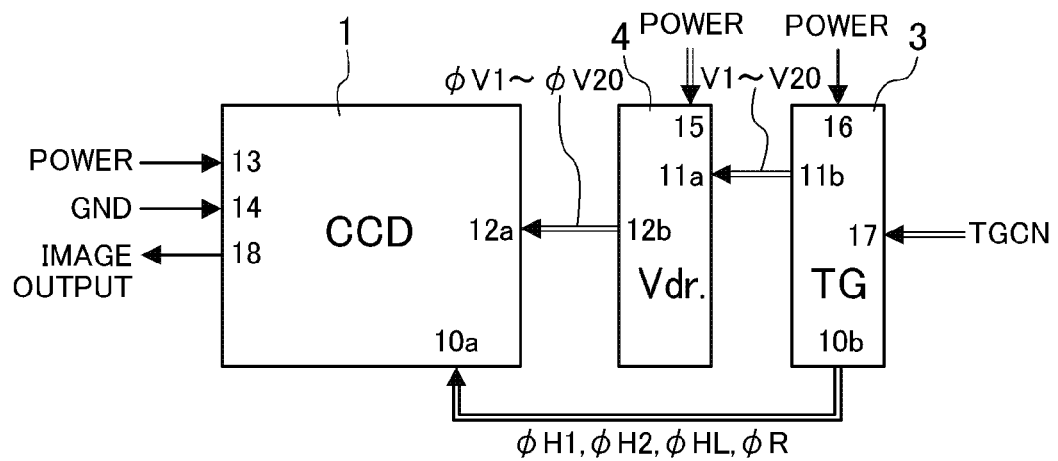
FIG. 2 is a block diagram of the solid-state image sensing device of FIG. 1.

FIG. 2 is a block diagram of the solid-state image sensing device of FIG. 1. As illustrated in FIG. 2, the CCD image sensor chip 1 originally includes 27 signal terminals in total, that is, horizontal CCD driving signal ($\phi$H1, $\phi$H2, $\phi$HL, $\phi$R) input terminals 10a, vertical CCD driving signal ($\phi$V1-$\phi$V20) input terminals 12a, a power supply terminal 13, a GND terminal 14, and an image output terminal 18. Note that the solid-state image sensing element of the present embodiment includes a minimum number of signal terminals, but may additionally include a clock input and a synchronous signal input as necessary.

Of these signal terminals, the horizontal CCD driving signal input terminals 10a are electrically connected to output terminals 10b of the timing generator chip 3 via the microbumps 6. The vertical CCD driving signal input terminals 12a are electrically connected to output terminals 12b of the CCD driver chip 4 via the microbumps 6. The power supply terminal 13 is configured as the power supply pad 5a. The GND terminal 14 is configured as the GND pad 5b. The image output terminal 18 is configured as the image output pad 5c. Power supply terminals 15 of the CCD driver chip 4 and a power supply terminal 16 of the timing generator chip 3 are connected to the power supply pads 5a via the microbumps 6. Control signal (TGCN) input terminals 17 of the timing generator chip 3 are connected to the control pads 5d via the microbumps 6.

As described above, the CCD image sensor chip 1 originally includes 27 signal terminals in total. When the timing generator chip 3 and the CCD driver chip 4 are flip-chip mounted to the CCD image sensor chip 1 via the microbumps 6, the number of pads 5 required for the solid-state image sensing device of the present embodiment is seven. That is, three power supply pads 5a, one GND pad 5b, one image output pad 5c, and three control pads 5d are only required. This configuration can significantly reduce packaging cost and the cost of mounting substrates in the process of mounting the solid-state image sensing device of the present embodiment to a camera, or the like.

Flip-chip mounting via the microbumps 6 enables high-speed pulse transfer because the connection distance between the chips is short, which reduces resistance, parasitic inductance, and parasitic capacitance. The mounting volume can also be significantly reduced compared to the conventional connection by wire bonds.

The CCD image sensor chip 1, the timing generator chip 3, and the CCD driver chip 4 include pads formed to be connected to the microbumps 6, respectively. Under the pads, other wiring layers than wiring layers included in the pads, and elements such as a transistor, resistor, capacitor, etc. are preferably formed. With this configuration, each chip can be designed to have a smaller size.

Note that in the present embodiment, the timing generator chip 3 and the CCD driver chip 4 are mounted as peripheral circuit elements because it is generally difficult to integrate these semiconductor elements into a single chip in one process. A single chip into which these semiconductor elements are integrated may be mounted, which is preferable for size reduction.

Figure 3:
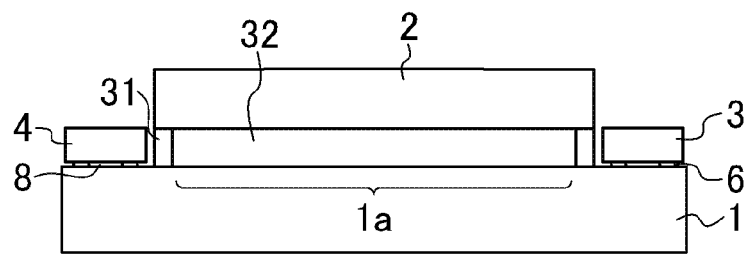
FIG. 3 is a side view illustrating another configuration of the solid-state image sensing device of the first embodiment.

FIG. 3 is a cross-sectional view illustrating a variation of the configuration of the solid-state image sensing device of the present embodiment. In the configuration of FIG. 3, a raised portion 31 is provided around an imaging region 1a, and glass 2 used as a transparent material is fixed to the raised portion 31 by, for example, an adhesive. That is, the glass 2 is supported by the raised portion 31 to cover the imaging region 1a, and a hollow portion 32 is formed between the imaging region 1a and the glass 2. The hollow portion 32 is filled with, for example, air or nitrogen. Also with the configuration illustrated in FIG. 3, the glass 2 can protect the imaging region 1a from dust and stress in fabrication processes or in use of the solid-state image sensing device as a product.

Second Embodiment

FIGS. 4A, 4B are views illustrating a configuration of a solid-state image sensing device of a second embodiment, where FIG. 4A is a side view, and FIG. 4B is a bottom view. Note that a plan view of the solid-state image sensing device of the second embodiment is substantially the same as that described in the first embodiment except that a sealing resin 24 is filled in an adjacent section of glass 2 of the second embodiment, and thus the plan view of the solid-state image sensing device is omitted herein.

The solid-state image sensing device illustrated in FIG. 4 includes through electrodes 20 electrically connecting a main face to a back face of a CCD image sensor chip 1, bumps 21 serving as connection terminals formed on the back face of the CCD image sensor chip 1, and wires 22 connecting the through electrodes 20 to the bumps 21. Pads 5 formed on the main face are electrically connected to the bumps 21 formed on the back face via the through electrodes 20 and the wires 22. Note that the bumps 21 may be formed under the through electrodes 20, or may be formed in positions except for the positions under the through electrodes 20. Note that although not shown, the through electrodes 20 and the wires 22 are electrically insulated from the CCD image sensor chip 1 via an insulator film.

With this configuration, the solid-state image sensing device can be mounted to a printed circuit board or a flexible substrate without wire bonds. Thus, the volume after the mounting can significantly be reduced compared to conventional mounting by wire bonds.

The sealing resin 24 is provided in the adjacent section of the glass 2 to cover a timing generator chip 3 and a CCD driver chip 4 which are flip-chip mounted. With this configuration, light is prevented from entering the timing generator chip 3 and the CCD driver chip 4 except for the imaging region, so that it is possible to prevent problems such as a flare and a ghost.

Third Embodiment

FIGS. 5A-5G are views illustrating a method for fabricating a solid-state image sensing device of a third embodiment. Here, the solid-state image sensing device of FIG. 1 is formed by the method illustrated in FIGS. 5A-5G.

First, a wafer having solid-state image sensing elements (CCD image sensor chips 1) formed thereon is prepared. Before a mounting process, a probe inspection is performed on the solid-state image sensing elements on the wafer (FIG. 5A).

Figure 5:
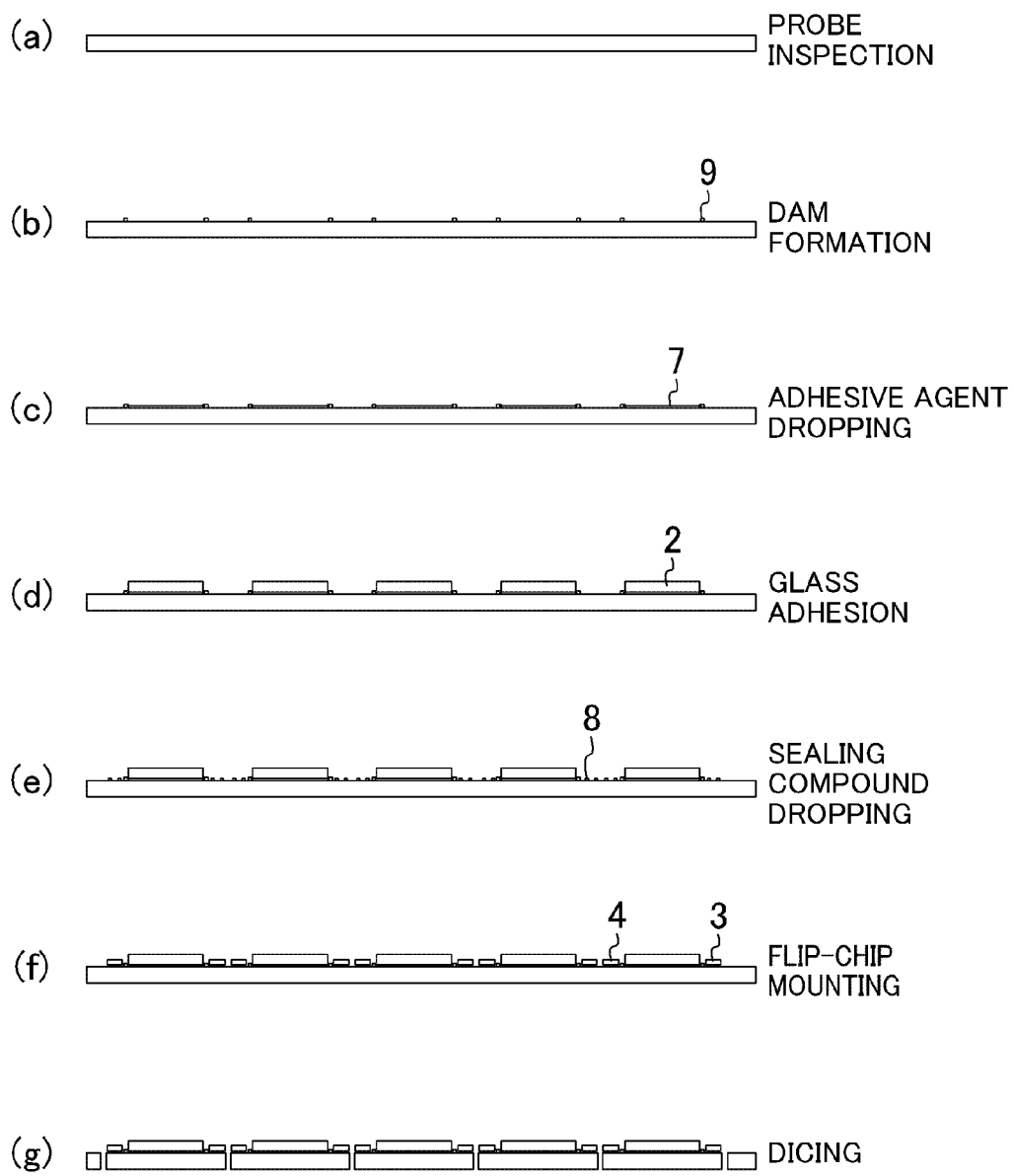
FIG. 5 is a view illustrating a method for fabricating a solid-state image sensing device of a third embodiment.

Next, dams 9 are formed for the solid-state image sensing elements on the wafer (FIG. 5B). The dams 9 may be formed by, for example, patterning by exposing and developing using a photosensitive resin. Alternatively, a dam material may coat the entire surface of the wafer, and then, predetermined sections may be subjected to lithography and etching as in general semiconductor processing.

Next, an adhesive 7 is dropped inside the dams 9, that is, on imaging regions (FIG. 5C). Here, a proper amount of the adhesive 7 has to be dropped so that the adhesive 7 does not flow out of the dams 9. The adhesive 7 may be ultraviolet curing type or may be heat curing type, but for curing during positioning in a subsequent adhering process, an ultraviolet curing type adhesive is preferable.

Next, glass 2 used as a transparent material is adhered to cover the imaging regions (FIG. 5D). Here, the adhesive 7 is preferably irradiated with ultraviolet light to be cured after positioning of the glass 2 so that the adhering position of the glass 2 can be controlled.

Next, sealant 8 is dropped in regions outside the imaging regions for flip-chip mounting (FIG. 5E). The sealant 8 used here is preferably transparent so that positioning during the flip-chip mounting is possible.

Next, timing generator chips 3 and CCD driver chips 4 having microbumps formed thereon are flip-chip-mounted (FIG. 5F). Tips of the microbumps are sharp and have an acute angle. When the timing generator chips 3 and the CCD driver chips 4 are mounted, the tips of the microbumps pass through the sealant 8, and reach flip-chip mounting pads of the CCD image sensor chip 1. Here, it is preferable to further apply pressure while applying ultrasonic waves to form high-quality ohmic contacts.

Finally, in a dicing process (FIG. 5G), individual pieces of solid-state image sensing elements are obtained from the wafer.

As described above, the transparent material is provided to cover the imaging regions of the solid-state image sensing elements. After providing the transparent material, the peripheral circuit elements are mounted by attaching, thereby eliminating a problem in which dust settles on the imaging regions, so that the influenced of the dust on the imaging regions can be avoided. The imaging regions can also be protected from stress exerted at the time of mounting.

It is of course preferable in terms of cost to perform the adhering process of the glass and the flip-chip mounting only on solid-state image sensing elements determined to be non-defective by the first performed probe inspection.

A fabrication method of the second embodiment has not been illustrated in the figure. However, for example, after the probe inspection illustrated in FIG. 5A, and before forming the dams illustrated in FIG. 5B, a through electrode process may be performed to form the through electrodes, the wires, and the bumps on the back face. Alternatively, the through electrode process may be performed after the adhering process of the glass and the flip-chip mounting.

Note that a pad subjected to the probe inspection (inspection pad) is preferably provided in addition to the flip-chip mounting pads to be joined to the microbumps (microbump joint pads) so that the microbumps are less likely to be influenced by marks formed by an inspection needle. Here, it is preferable that the inspection pad have a minimum area, and the microbump joint pads each have a minimum area.

The solid-state image sensing element does not necessarily include the number of inspection pads to inspect all functions of the solid-state image sensing element. The number of the inspection pads is preferably limited to a number that is satisfactory for inspection of some important functions. Thus, the area of the solid-state image sensing element cannot be increased by the pads.

Note that in the above-described first to third embodiments, the solid-state image sensing element has been a CCD image sensor chip, but may be, for example, a CMOS sensor chip or NMOS sensor chip. The peripheral circuit elements to be flip-chip mounted are not limited to the timing generator chip and the CCD driver chip described here, but may be other elements configured to control imaging operation of the solid-state image sensing element, or elements configured to perform signal processing of an image output of the solid-state image sensing element, for example, an A/D converter, an analog front end, and a digital signal processor.

Fourth Embodiment

FIGS. 6A, 6B are views illustrating a configuration of a solid-state image sensing device of a fourth embodiment, where FIG. 6A is a plan view, and FIG. 6B is a cross-sectional view along the line A-A' of FIG. 6A. In FIGS. 6A, 6B, reference number 51 denotes an image sensor chip serving as a solid-state image sensing element. The image sensor chip 51 includes an imaging region 52 in which unit pixels containing photoelectric conversion elements are formed in matrix, a scan circuit 53 configured to control reading of the imaging region 52, a pixel signal processing circuit 54 configured to subject pixel signals read out from the imaging region 52 to noise reduction, A/D conversion, or the like, and input/output terminals 55 configured to perform input from and output to the outside of the solid-state image sensing device. The input/output terminals 55 also include an internal circuit containing a protection circuit implemented with, for example, a high voltage transistor. The image sensor chip 51 is, for example, a MOS image sensor such as a CMOS sensor chip, NMOS sensor chip, etc., or a CCD image sensor chip.

Reference number 61 denotes a signal processing chip serving as a signal processing element. As illustrated in FIG. 6B, the signal processing chip 61 is mounted by attaching to a region of a main face of the image sensor chip 51 except for the imaging region 52 such that a main face of the signal processing chip 61 faces the main face of the image sensor chip 51. That is, the signal processing chip 61 is flip-chip mounted to the image sensor chip 51 via a plurality of microbumps 57, and electric pathways to the image sensor chip 51 are formed in the region where the signal processing chip 61 is mounted to the image sensor chip 51. Input/output between the signal processing chip 61 and the outside of the solid-state image sensing device is performed via the electric pathways formed by the microbumps 57 and the internal circuits and the input/output terminals 55 of the image sensor chip 51. The signal processing chip 61 does not include an input/output terminal configured to directly perform input from and output to the outside of the solid-state image sensing device.

Figure 7:
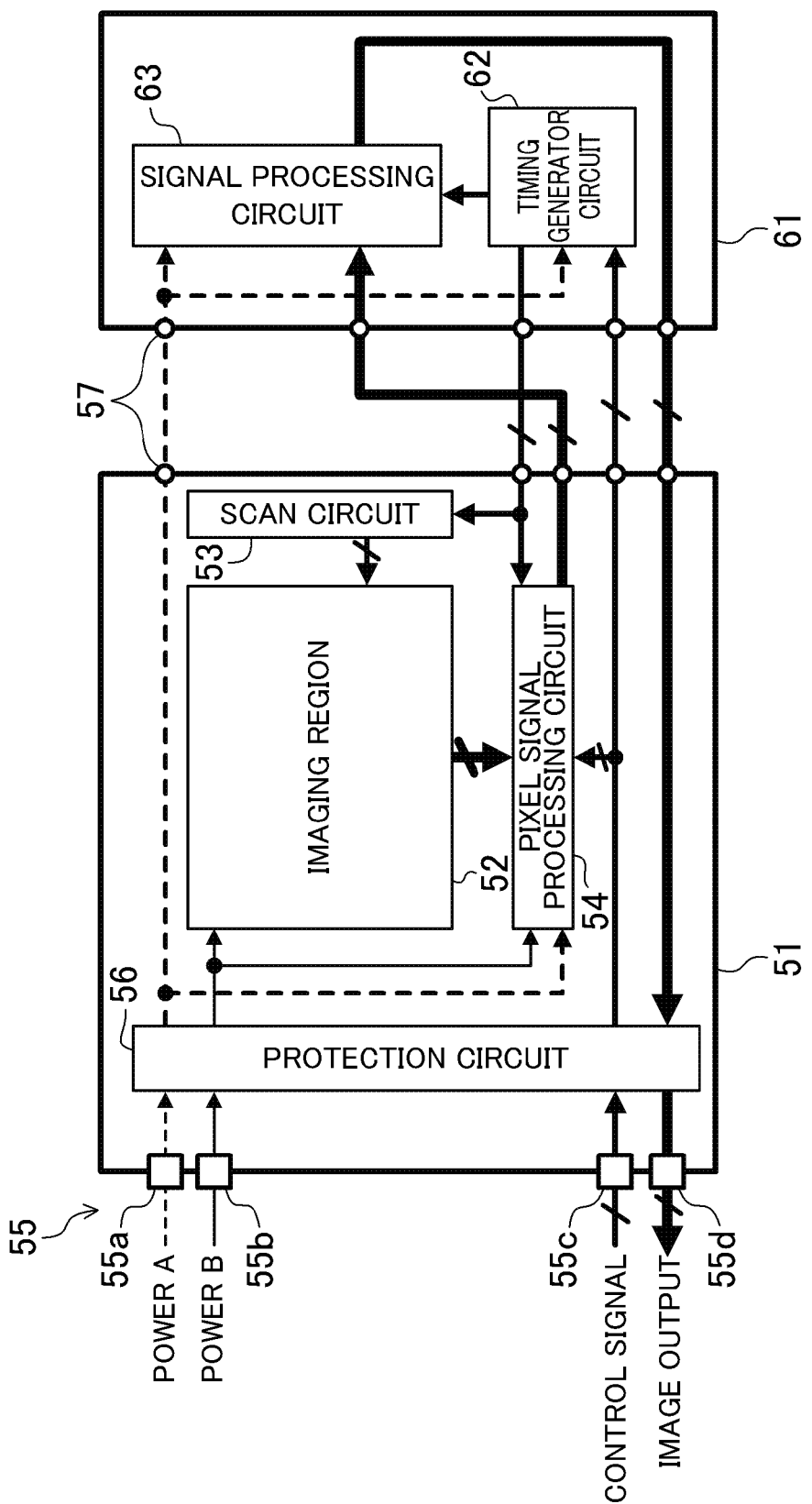
FIG. 7 is a block diagram of the solid-state image sensing device of the fourth embodiment.

FIG. 7 is a block diagram of the solid-state image sensing device of FIGS. 6A, 6B. As illustrated in FIG. 7, the image sensor chip 51 includes, as the input/output terminals 55, power supply input terminals 55a, 55b for a plurality of types of power (herein, power A and power B) having different voltages, a control signal input terminal 55c, and an image output terminal 55d. In addition to the input/output terminals 55, a protection circuit 56 is provided as the internal circuit. The protection circuit 56 may include, for example, a level shifter circuit for voltage conversion. The signal processing chip 61 includes only logic circuits, and is provided with a timing generator circuit 62 configured to control driving of the image sensor chip 51, etc., and a signal processing circuit 63 configured to process signals from the image sensor chip 51.

Power supplied from the image sensor chip 51, a control signal, and an image output are input to the signal processing chip 61 via the microbumps 57. The signal processing chip 61 outputs the image output processed with signal processing circuit 63 to the image sensor chip 51 via the microbump 57. That is, the image output of the image sensor chip 51 is transmitted to the signal processing chip 61 via the microbump 57, is subjected to signal processing in the signal processing chip 61, and then is retransmitted to the image sensor chip 51 via the microbump 57. Then, the image output is output, via the protection circuit 56 of the image sensor chip 51, from the image output terminal 55d to the outside of the solid-state image sensing device.

As described above, according to the present embodiment, it is no longer necessary to provide the solid-state image sensing device with a complicated configuration such as a back face irradiation type solid-state image sensing element, a through wire interconnect structure, or a multilayer substrate in order to electrically connect the image sensor chip 51 to the signal processing chip 61. Thus, the size and cost of the solid-state image sensing device can be reduced.

Input/output between the signal processing chip 61 and the outside of the solid-state image sensing device is performed via the internal circuit and the input/output terminals 55 of the image sensor chip 51. Thus, it is not necessary to provide the signal processing chip 61 with a special protection circuit implemented with, for example, a high voltage transistor. Therefore, the microbumps 57 of the signal processing chip 61 can be arranged at a narrow pitch, so that it is possible to avoid a problem in which the chip size of the signal processing chip 61 depends on the number of input/output terminals.

Moreover, according to the present embodiment, the image output after the signal processing with the signal processing chip 61 is output from an output circuit of the image sensor chip 51, and thus it is not necessary to provide the signal processing chip 61 with a high voltage transistor for the output circuit. Thus, the chip size can further be reduced.

Further, it is sufficient for the signal processing chip 61 including only the logic circuits to be supplied with power having a voltage of such a low level that the logic circuits satisfactorily operate. Thus, in the present embodiment, of a plurality of types of power supplied to the image sensor chip 51, a type of power having a lowest voltage (herein, power A) is supplied to the signal processing chip 61 via the microbump 57. With this configuration, a transistor of the signal processing chip 61 can be configured as a transistor having a thin gate oxide film corresponding to low-voltage power. Thus, the high voltage transistor for the protection circuit as described above is not necessary, and in addition to that, a low-cost signal processing chip 61 can be formed in simple fabrication processes.

Furthermore, in the solid-state image sensing device of the present embodiment, the layout rule of wiring and the number of wiring layers of the image sensor chip 51 and the signal processing chip 61 can be optimized. Specifically, in the signal processing chip 61 which includes only the logic circuits, and is driven at a low voltage, wires and transistors may be laid out based on a fine design rule, and the number of wiring layers may be increased along with a circuit scale, thereby improving the occupancy. Thus, the size of the signal processing chip 61 can significantly be reduced. In this case, the number of wiring layers of the signal processing chip 61 is larger than that of the wiring layers of the image sensor chip 51.

Fifth Embodiment

Figure 8:
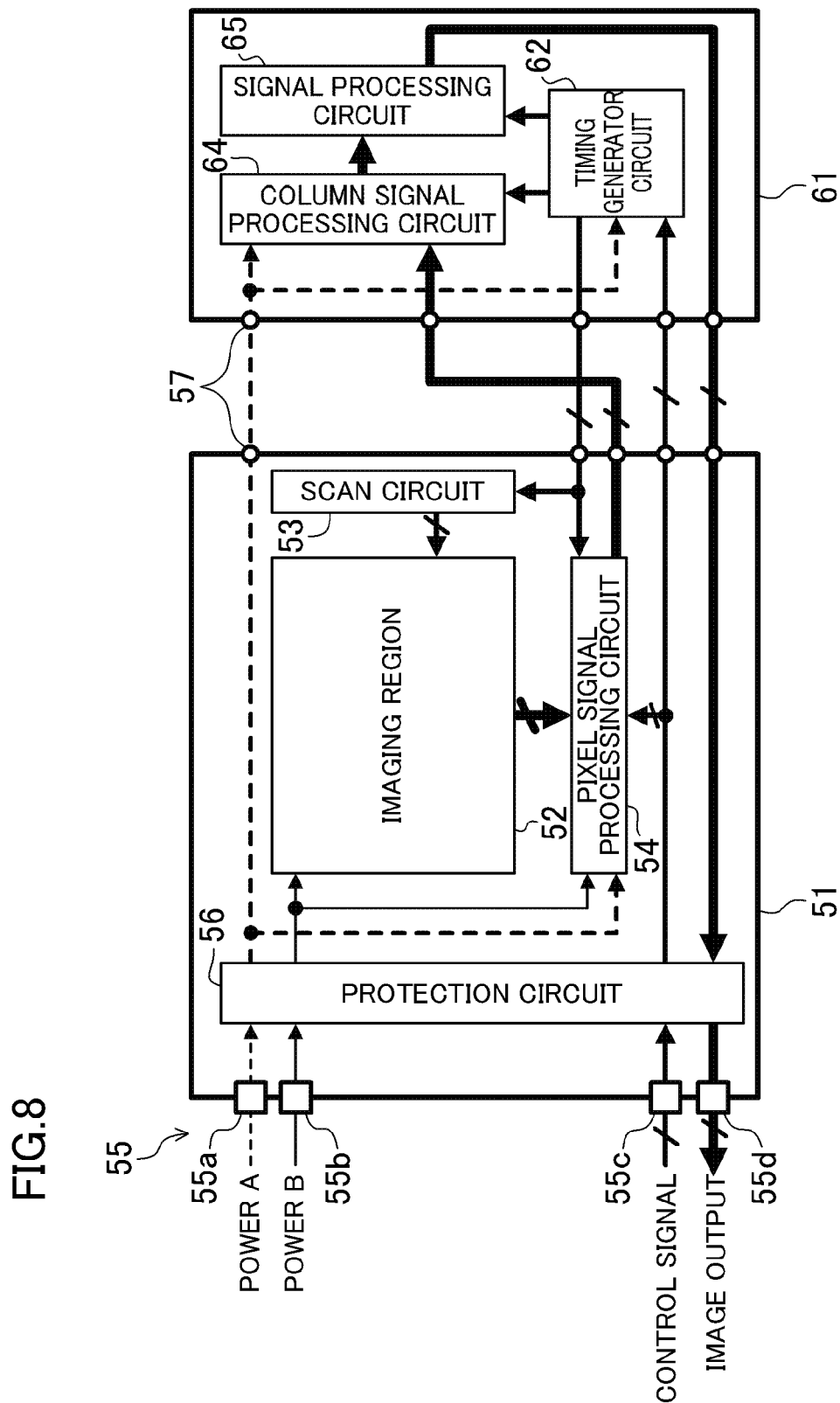
FIG. 8 is a block diagram of a solid-state image sensing device of a fifth embodiment.

FIG. 8 is a block diagram of a solid-state image sensing device of a fifth embodiment. A view illustrating a configuration of the solid-state image sensing device of the present embodiment is the same as that illustrated in FIG. 6. In FIG. 8, components identical, functionally similar, and/or equivalent to those in FIG. 7 are identified by the same reference symbols as those in FIG. 7, and the explanation thereof is omitted.

Also in the present embodiment, a signal processing chip 61 is, as illustrated in FIG. 6B, flip-chip mounted to a region of a main face of an image sensor chip 51 except for an imaging region 52 via a plurality of microbumps 57, and electric pathways to the image sensor chip 51 are formed in the region where the signal processing chip 61 is mounted to the image sensor chip 51. Input/output between the signal processing chip 61 and the outside of the solid-state image sensing device is performed via the electric pathways formed by the microbumps 57, an internal circuit, and input/output terminals 55 of the image sensor chip 51.

The fifth embodiment is different from the fourth embodiment in that the image sensor chip 51 is configured to be capable of outputting picture signals of a plurality of columns of the imaging region 52 in parallel. The signal processing chip 61 includes only logic circuits, and is provided with a timing generator circuit 62 configured to control driving of the image sensor chip 51, etc., a column signal processing circuit 64 configured to process the picture signals of the plurality of columns which are output from the image sensor chip 51, and a signal processing circuit 65 configured to reprocess the signals processed with the column signal processing circuit 64.

Figure 9:
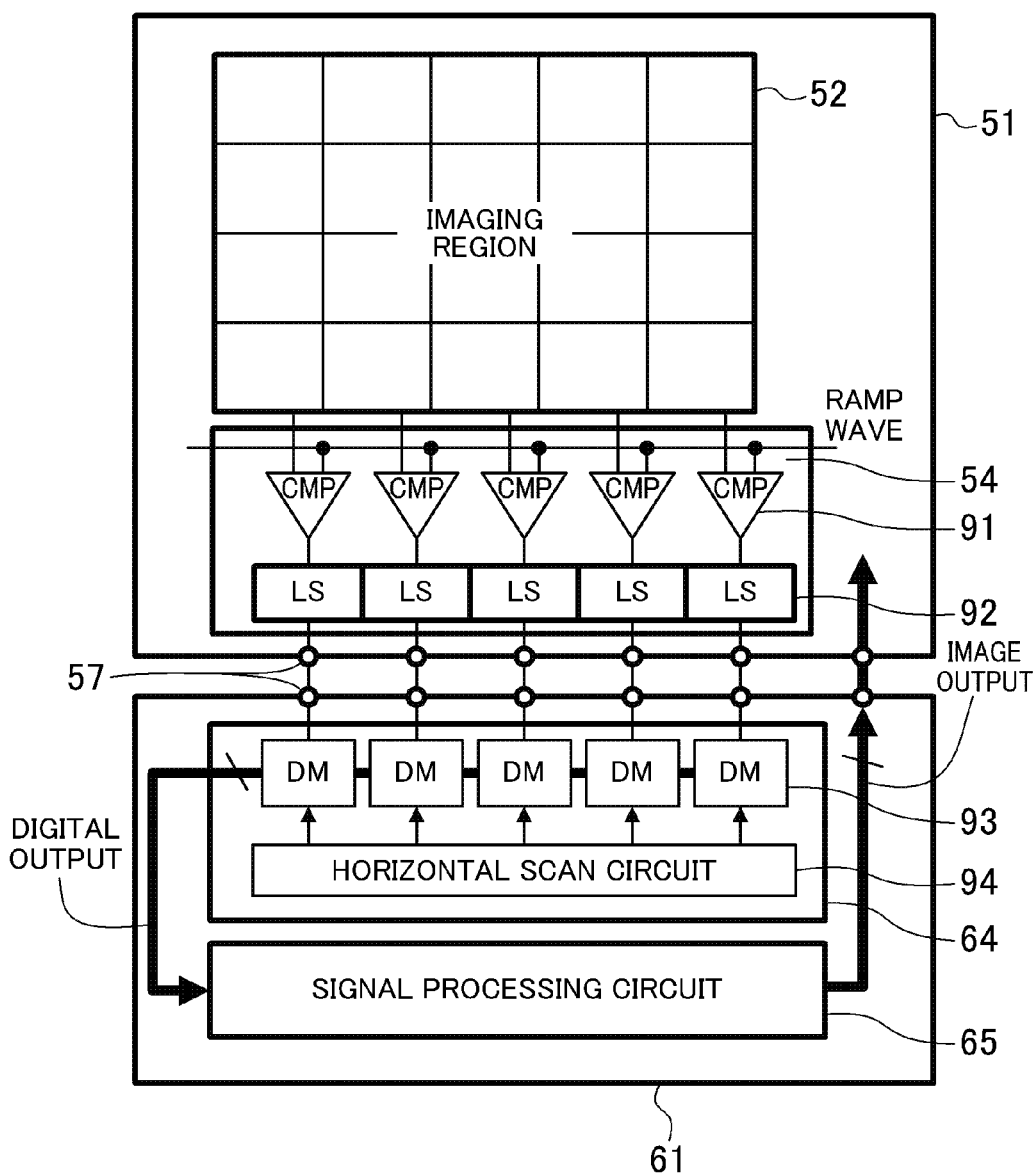
FIG. 9 is a detailed block diagram of the solid-state image sensing device of the fifth embodiment.
Figure 10:
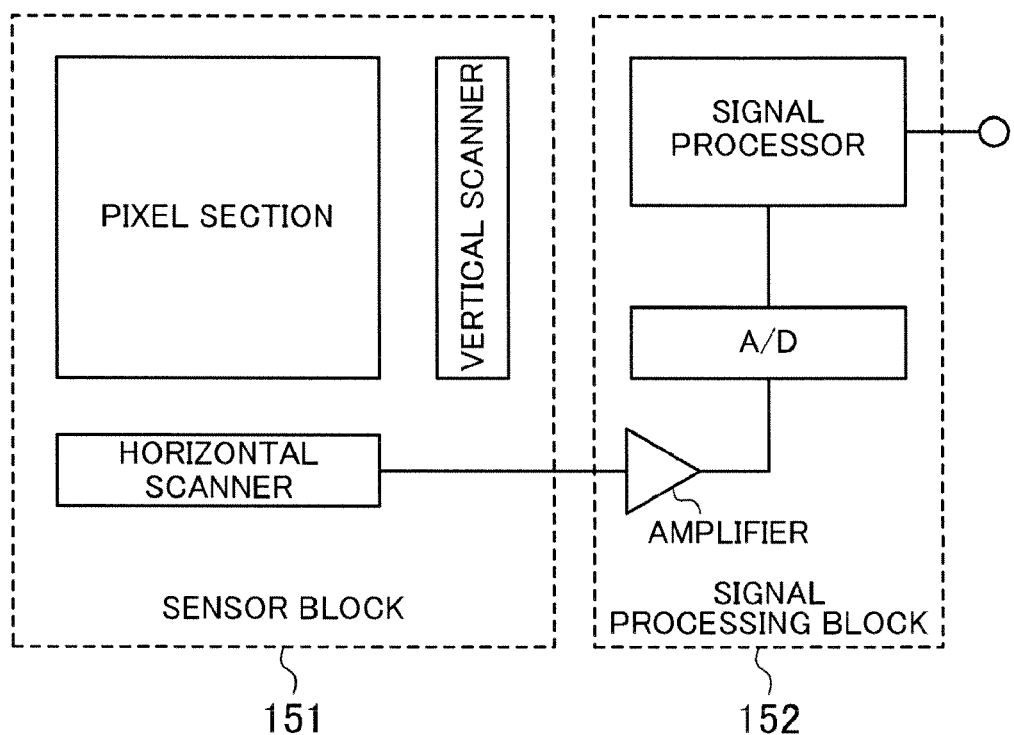
FIG. 10 is a block diagram of a conventional solid-state image sensing device.
Figure 11:
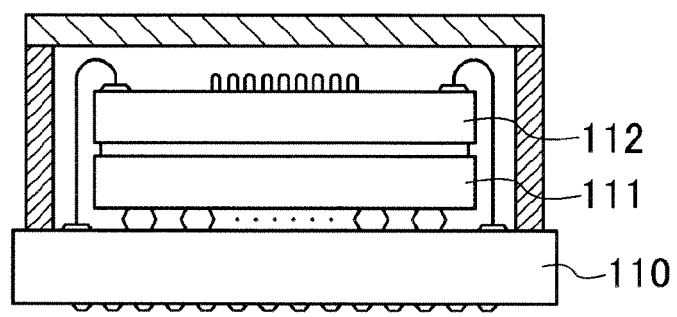
FIG. 11 is a view illustrating an example of a conventional configuration.
Figure 12:
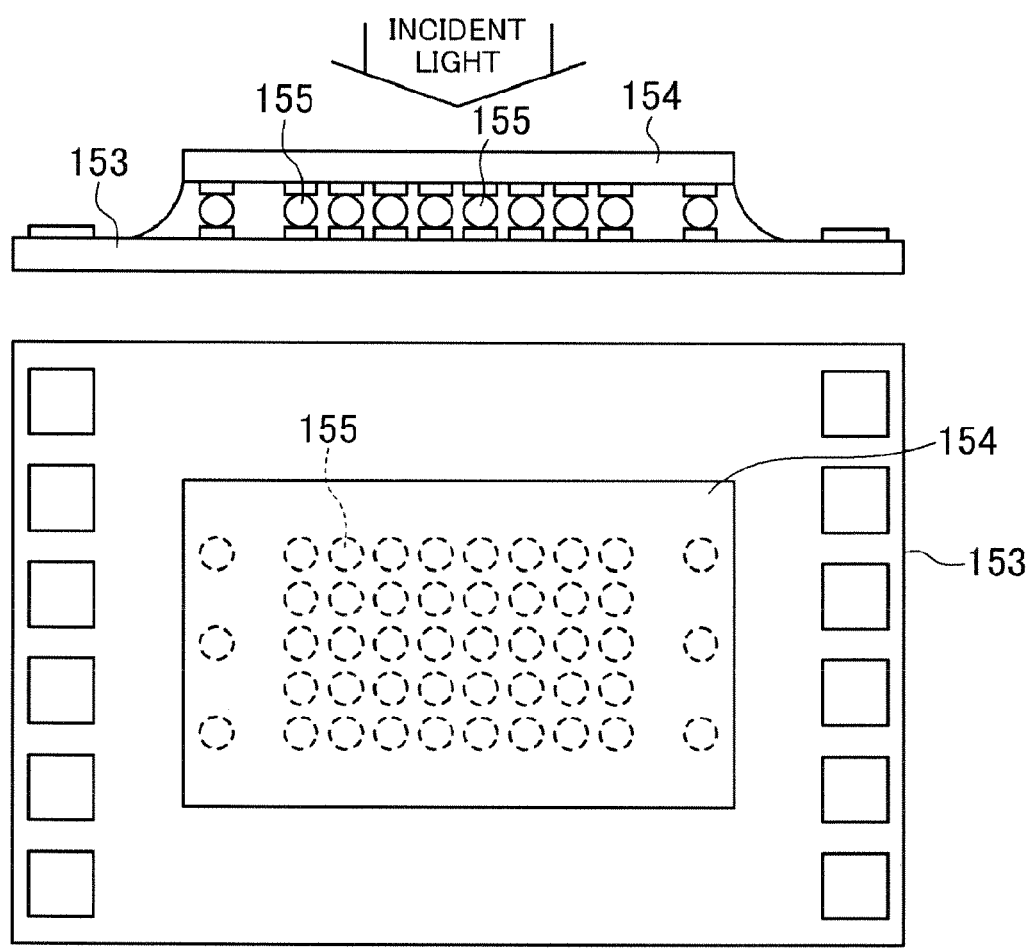
FIG. 12 is a view illustrating a configuration of a conventional solid-state image sensing device.

FIG. 9 is a detailed block diagram illustrating signal connection between a pixel signal processing circuit 54 of the image sensor chip 51 and the column signal processing circuit 64 and the signal processing circuit 65 of the signal processing chip 61. As illustrated in FIG. 9, the pixel signal processing circuit 54 includes comparators 91 configured to compare pixel signals output from the imaging region 52 with a ramp waveform to perform A/D conversion, and level shifters 92 configured to convert output voltages after the A/D conversion to low voltages which can be processed with the signal processing chip 61. The comparator 91 and the level shifter 92 are provided to each column of the imaging region 52. The microbumps 57 are provided to transfer outputs of the level shifters 92, i.e., the picture signals of the columns to the signal processing chip 61.

The outputs of the level shifters 92 are sent to the column signal processing circuit 64 of the signal processing chip 61 respectively via the microbumps 57. The column signal processing circuit 64 includes digital memories 93 provided to the microbumps 57, respectively, and a horizontal scan circuit 94 configured to select the digital memory 93 to be subjected to reading operation. The digital memories 93 store the picture signals received via the microbumps 57 as digital signals of, for example, 8-14 bits. The digital signals stored in the digital memories 93 are sequentially selected by the horizontal scan circuit 94, and transmitted to the signal processing circuit 65 as digital outputs. The signal processing circuit 65 performs signal processing such as black level adjustment, defect correction, etc. The picture signals after the signal processing are retransmitted to the image sensor chip 51 via the microbumps 57, and then are output as image outputs via the input/output terminals of the image sensor chip 51.

As described above, according to the present embodiment, the microbumps 57 can be arranged at a narrow pitch, which allows the microbumps 57 to be provided to respectively transmitting the picture signals of the plurality of columns, so that it is possible to transfer the picture signals of the plurality of columns in parallel between the image sensor chip 51 and the signal processing chip 61. In addition to this, the microbumps 57 have a low resistance because the connection distance between the chips is small, and thus parasitic inductance and parasitic capacitance are small. Thus, signal transmission at high speed with low power consumption is possible.

Moreover, in the present embodiment, the pixel signal processing circuit 54 including analog circuits such as the comparators 91 requiring a high voltage to obtain a wide dynamic range and a high S/N ratio is disposed in the image sensor chip 51, and the column signal processing circuit 64 including the digital memories 93 which can operate at a low voltage is disposed in the signal processing chip 61 including only the digital circuits. With this configuration, for example, the signal processing chip 61 may include only a transistor having a thin gate oxide film corresponding to low power, and types of transistors respectively used for chips can be optimized. Thus, a low-cost, solid-state image sensing device can be formed in simple fabrication processes.

Further, it is preferable in the signal processing chip 61 that wires and transistors be laid out based on an optimum, fine design rule, and the number of wiring layers be increased along with the circuit scale, thereby improving the occupancy. With this configuration, the area of the column signal processing circuit 64 provided with a large number of logic circuits such as the digital memories 93 including, for example, a large number of latched circuits to store multi-bit digital signals can significantly be reduced compared to the case where the column signal processing circuit 64 is mounted to the image sensor chip 51.

Note that the present embodiment has a configuration in which the picture signals of the columns of the imaging region 52 are transmitted to the signal processing chip 61 via the microbumps 57 respectively corresponding to the picture signals, but the invention is not limited to this embodiment. For example, a selector may be provided between the microbump 57 and the level shifters 92 to associate the plurality of columns with one microbump 57, and the picture signals may selectively be output to the signal processing chip 61 via the microbump 57. This is advantageous, for example, when the pitch between the columns of the imaging region 52 does not match the pitch at which the microbumps 57 can be arranged.

Furthermore, in the fourth and fifth embodiments, an example in which one signal processing element is mounted to the solid-state image sensing element has been described, but a plurality of signal processing elements may be mounted to regions of the solid-state image sensing element except for the imaging region. For example, a digital signal processor is mounted to the solid-state image sensing element, thereby producing a solid state imaging camera as a chip set.

In the present invention, the size and cost of the solid-state image sensing device can be reduced, so that for example, high-speed, low-power-consumption, small, and low-cost digital cameras, movie cameras, etc. can be obtained, and the present invention is useful.

What is claimed is:

1. A solid-state image sensing device comprising:
   a solid-state image sensing element having a main face provided with an imaging region in which unit pixels containing photoelectric conversion elements are formed in matrix; and
   a signal processing element having a main face provided with a circuit configured to perform signal processing of an image output of the solid-state image sensing element, wherein
   the solid-state image sensing element and the signal processing element are mounted by being stacked, and an electric pathway to the solid-state image sensing element is formed in the region where the signal processing element is mounted to the solid-state image sensing element,
   input/output between the signal processing element and an outside of the solid-state image sensing device is performed via the electric pathway, and an internal circuit and an input/output terminal of the solid-state image sensing element,
   the solid-state image sensing element is supplied with a plurality of types of power,
   a type of power having a lowest voltage among the plurality of types of power supplied to the solid-state image sensing element is supplied to the signal processing element via the electric pathway, and
   the solid-state image sensing element includes a protection circuit implemented with a high voltage transistor.

2. The solid-state image sensing device of claim 1, wherein
   the signal processing element is mounted to the solid-state image sensing element via a plurality of microbumps, and
   the image output of the solid-state image sensing element is transmitted to the signal processing element via any of the plurality of microbumps, is subjected to signal processing in the signal processing element, is retransmitted to the solid-state image sensing element via any of the plurality of microbumps, and is output to the outside of the solid-state image sensing device from the input/output terminal.

3. The solid-state image sensing device of claim 1, wherein a number of wiring layers of the signal processing element is larger than that of wiring layers of the solid-state image sensing element.

4. The solid-state image sensing device of claim 1, wherein
   the signal processing element is mounted to the solid-state image sensing element via a plurality of microbumps,
   the solid-state image sensing element is configured to be capable of outputting picture signals of a plurality of columns of the imaging region in parallel, and
   the picture signals of the plurality of columns output from the solid-state image sensing element are respectively transmitted via the plurality of microbumps to the signal processing element.

5. The solid-state imaging device of claim 1, wherein a transistor of the signal processing element is configured as a transistor having a thin gate oxide film corresponding to the power having a lowest voltage.

* * * * *